United States Patent
Singh et al.

(10) Patent No.: US 10,037,796 B2
(45) Date of Patent: Jul. 31, 2018

(54) GENERATING A COLLAPSED VDD USING A WRITE-ASSIST COLUMN TO DECREASE A WRITE VOLTAGE

(71) Applicant: TAIWAN SEMICONDUCTOR MANUFACTURING CO., LTD., Hsin-Chu (TW)

(72) Inventors: Sahil Preet Singh, Hsinchu (TW); Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/468,551

(22) Filed: Mar. 24, 2017

(65) Prior Publication Data

US 2018/0151220 A1    May 31, 2018

Related U.S. Application Data

(60) Provisional application No. 62/427,528, filed on Nov. 29, 2016.

(51) Int. Cl.
*G11C 11/00* (2006.01)
*G11C 11/419* (2006.01)

(52) U.S. Cl.
CPC ................. *G11C 11/419* (2013.01)

(58) Field of Classification Search
CPC ............................ G11C 11/0054; G11C 7/12
USPC ........................ 365/154, 226, 227
See application file for complete search history.

(56) References Cited

U.S. PATENT DOCUMENTS

| | | | |
|---|---|---|---|
| 6,075,729 A * | 6/2000 | Ohhata | G11C 7/12 365/154 |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,760,958 B2 * | 6/2014 | Iyer | G11C 11/412 365/154 |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 2010/0054062 A1 * | 3/2010 | Kobatake | G11C 7/12 365/201 |
| 2014/0153345 A1 | 6/2014 | Kim et al. | |
| 2014/0233330 A1 | 8/2014 | Ko et al. | |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |

* cited by examiner

*Primary Examiner* — Han Yang
(74) *Attorney, Agent, or Firm* — Duane Morris LLP (57) ABSTRACT

A write-assist cell includes a first pull-up transistor electrically coupled to a voltage array and a first node, a first pass-gate transistor electrically coupled to the first node, and a bit-line electrically coupled to the first pass-gate transistor and a pull-down voltage. The first pass-gate is configured to selectively couple the bit-line to the first node. The pull-down voltage is configured to adjust a voltage of the voltage array from a first voltage to a second voltage when the bit-line is coupled to the first node.

20 Claims, 5 Drawing Sheets

GENERATING A COLLAPSED VDD USING A WRITE-ASSIST COLUMN TO DECREASE A WRITE VOLTAGE

CROSS-REFERENCE TO RELATED APPLICATION

This application claims benefit to U.S. Provisional Appl. Ser. No. 62/427,528, filed Nov. 29, 2016, entitled "GENERATING A COLLAPSED VDD USING A WRITE-ASSIST COLUMN TO DECREASE A WRITE VOLTAGE," which is incorporated herein in its entirety.

FIELD

This disclosure relates to static random-access memory (SRAM), and more specifically, to controlling write voltages of SRAM cells.

BACKGROUND

Current SRAM arrays have a minimum write voltage ($V_{min}$) that is determined by each of the SRAM cells in the array. A lower $V_{min}$ provides a lower power usage and better efficiency during write operations. However, as $V_{min}$ is reduced, write-ability of the SRAM cell decreases as the threshold voltage ($V_t$) of the transistors in the SRAM cells cannot be reduced proportionally to the reduction in $V_{min}$. Lower write voltages reduce headroom (e.g., the voltage difference or buffer between an input voltage (VDD) and a threshold voltage ($V_t$). Current systems utilize write assist techniques to improve the write-ability of a bit-cell.

Current write assist techniques include using a negative bit-line voltage or decreasing the strength of a PMOS (p-channel metal-oxide silicon device) in a latch portion of a bit-cell. However, the negative BL encounters a high resistance on the BL and rapidly dissipates, such that the voltage at a bitcell on a top row is ineffective for adjusting the strength of the passgate. Similarly, decreasing the strength of the PMOS in a latch increases memory errors and reduces reliability of the SRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion. Terms concerning attachments, coupling and the like, such as "connected," "interconnected," "electrically connected," and "electrically coupled" refer to a relationship wherein structures are electrically attached or coupled to one another, either directly or indirectly through intervening circuit elements, as well as both wired or wireless attachments or relationships, unless expressly described otherwise.

In various embodiments, a write-assist column is disclosed. The write-assist column includes a plurality of write-assist cells. In some embodiments, each of the write-assist cells includes a first pull-up transistor and a second pull-up transistor coupled to an input voltage array. The input voltage array is maintained at a system voltage. Each of the write-assist cells further include a first pass-gate transistor coupled between the first pull-up transistor and a bit-line (BL) and a second pass-gate transistor coupled between the second pull-up transistor and a complimentary bit-line (BLB). Each of the pass-gate transistors are controlled by one or more control signals. A first write-assist transistor couples the BL to a pull-down voltage and a second write-assist transistor couples the BLB to the pull-down voltage. The first and second write-assist transistors are controlled by a control signal. When the control signal(s) turn on the pass-gate transistors and/or the write-assist transistors, the voltage of the voltage array is pulled down to a predetermined write voltage. A write operation can be performed by a memory array coupled to the voltage array using the lower predetermined write voltage, in accordance with various embodiments.

Figure 1:
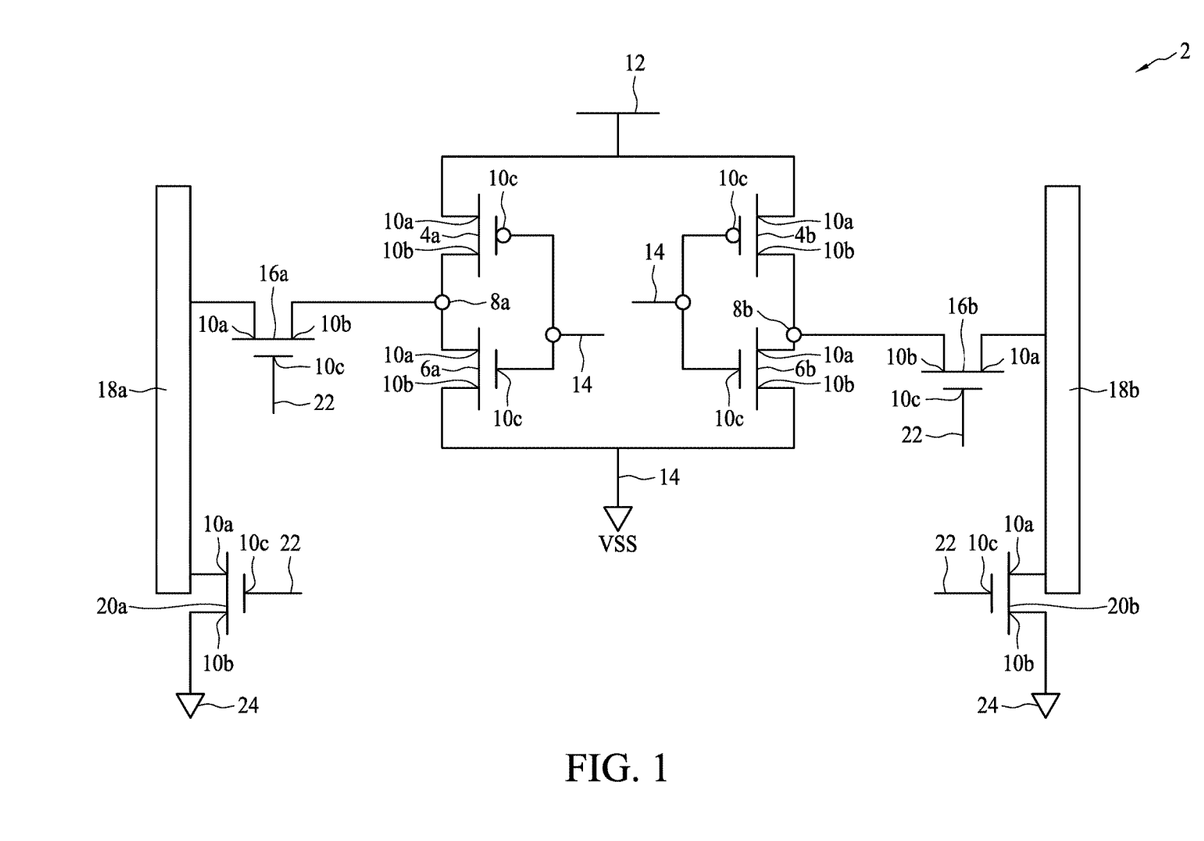
FIG. 1 illustrates a schematic diagram of write-assist cell coupled to a voltage array, in accordance with some embodiments.

FIG. 1 illustrates a write-assist cell 2 electrically coupled to a voltage array 12, in accordance with some embodiments. The write-assist cell 2 includes first and second pull-up (PU) transistors 4a, 4b and first and second pull-down (PD) transistors 6a, 6b. Each of the PU transistors 4a, 4b are coupled to a voltage array 12 at a first side 10a and a respective node 8a, 8b at a second side 10b. Each of the PD transistors 6a, 6b are coupled to the respective node 8a, 8b at a first side 10a and to a second voltage input 14 at a second side 10b. The first side 10a can be one of a source or a drain and the second side 10b is the remaining one of the source or the drain. The gates 10c of each of the PU transistors 4a, 4b and the PD transistors 6a, 6b are coupled the second voltage input 14.

In some embodiments, the voltage array 12 provides a positive and/or high voltage (VDD) and the second voltage 14 provides a negative and/or low voltage input (VSS). The voltage array 12 is configured to provide a voltage within a predetermined range. For example, in some embodiments, the voltage array 12 is configured to provide an input voltage between a system voltage (CVDD) and a predetermined threshold voltage ($V_t$).

When the PU transistors 4a, 4b are turned on (e.g., VDD-VSS is greater than a threshold voltage $V_t$ of the PU transistors 4a, 4b), the first node 8a and the second node 8b are coupled to and have the same voltage as the voltage array 12. For example, as shown in FIG. 1, the gates 10c of each of the PU transistors 4a, 4b and the PD transistors 6a, 6b are coupled to VSS. Because VDD minus VSS is greater than a threshold voltage, the PU transistors 4a, 4b are turned on, and the first and second nodes 8a, 8b are coupled to the voltage array 12. The PD transistors 6a, 6b have a drain 10b and a gate 10c each coupled to VSS, and therefore are turned off.

In some embodiments, a first pass-gate (PG) transistor 16a is coupled between the first node 8a and a BL 18a and a second PG transistor 16b is coupled between the second node 8b and a BLB 18b. Each of the PG transistors 16a, 16b are coupled to their respective nodes 8a, 8b at a first side 10a and are coupled to the respective BL 8a or BLB 8b at a second side 10b. A gate 10c of each of the PG transistors 16a, 16b is configured to receive a control signal 22. The control signal 22 is configured to control operation of the PG transistors 16a, 16b. When the PG transistors 16a, 16b are turned on (e.g., the control signal 22 is set to a first predetermined value), the BL 8a and the BLB 8b are respectively coupled to first and second nodes 8a, 8b. When the PG transistors 16a, 16b are turned off (e.g., the control signal 22 is set to a second predetermined value), the BL 8a and the BLB 8b are disconnected from respective first and second nodes 8a, 8b. The control signal 22 can be generated by one or more memory control units and/or one or more additional circuit elements (not shown).

In some embodiments, the BL 18a is coupled to a first write-assist transistor 20a and the BLB 18b is coupled to a second write-assist transistor 20b. The write-assist transistors 20a, 20b are coupled to the respective BL 18a and BLB 18b at a first side 10a. The write-assist PD transistors 20a, 20b are coupled to an pull-down voltage input 24 at a second side 10b. The pull-down voltage is less than CVDD. In some embodiments, the pull-down voltage is equal to zero (e.g., the pull-down voltage input 24 is coupled to ground). Although embodiments are discussed herein including write-assist transistors 20a, 20b, in some embodiments, the BL 18a and/or the BLB 18b are coupled directly to the pull-down voltage input 24 and the BL 18a and/or the BLB 18b have a constant voltage equal to the pull-down voltage.

In some embodiments, the gate 10c of each of the write-assist transistors 20a, 20b is configured to receive the control signal 22. The control signal 22 is configured to control operation of the write-assist transistors 20a, 20b. When the control signal 22 turns on the write-assist transistors 20a, 20b, the BL 18a and the BLB 18b are set to the pull-down voltage. When the control signal 22 turns the write-assist transistors 20a, 20b off, the BL 18a and the BLB 18b are disconnected from the pull-down voltage. In some embodiments, the write-assist transistors are PMOS pull-down transistors, although it will be appreciated that any suitable transistor, such as a PMOS pull-down transistor, an NMOS pull-down transistor, a pull-up transistor, and/or any other suitable transistor can be used.

In some embodiments, the control signal 22 is configured to control operation of one or more transistors, such as the PG transistors 16a, 16b and/or the write-assist transistors 20a, 20b to adjust the voltage of the voltage array 12. In some embodiments, the control signal 22 is set to a first value to turn on one or more transistors 16a, 16b, 20a, 20b. The one or more activated transistors 16a, 16b, 20a, 20b are configured to decrease the voltage of the voltage array 12 from the system voltage (CVDD) to a predetermined write voltage. The predetermined write voltage is less than the system voltage. In some embodiments, the predetermined write voltage is equal to a threshold voltage of the PU transistors 4a, 4b. In other embodiments, the predetermined write voltage is equal to a threshold voltage of one or more PU transistors in one or more bit-cells in a memory array coupled to the voltage array 12.

For example, in some embodiments, when the control signal 22 is set to the first value, the write-assist transistors 20a, 20b are turned on and the BL 18a and/or the BLB 18b are connected to the pull-down voltage input 22. The voltage of the BL 18a and the BLB 18b is set to the pull-down voltage. Simultaneously, the control signal 22 turns on the PG transistors 16a, 16b. The PG transistors 16a, 16b couple the BL 8a and/or the BLB 8b to respective first and second nodes 8a, 8b. As discussed above, the first and second nodes 8a, 8b are electrically coupled to the voltage array 12 and have an initial voltage equal to the system voltage. When the control signal 22 turns on the PG transistors 16a, 16b, the voltage of the first and second nodes 8a, 8b is pulled down by the BL 18a and/or BLB 18b. Because the first and second nodes 8a, 8b are coupled to the voltage array 12, the voltage of the voltage array 12 is also pulled down by the BL 18a and/or the BLB 18b. In some embodiments, the voltage of the voltage array 12 is pulled down from the system voltage to a predetermined write voltage.

In some embodiments, the predetermined write voltage is equal to the threshold voltage of the PU transistors 4a, 4b. For example, when the PG transistors 16a, 16b are turned on by the control signal 22, the BL 18a and/or the BLB 18b begin pulling down the voltage of the first and second nodes 8a, 8b and the voltage array 12. The voltage is pulled down until the difference between the voltage at the first and second nodes 8a, 8b and the second voltage 14 is less than the threshold voltage of the PU transistors 4a, 4b. When the voltage difference is less than the threshold voltage, the PU transistors 4a, 4b are turned off and the voltage array 12 is maintained at a voltage substantially equal to the threshold voltage of the PU transistors 4a, 4b. In other embodiments, the pull-down voltage is greater than the threshold voltage of the PU transistor 4a, 4b and the voltage array 12 is pulled down to a voltage substantially equal to the pull-down voltage 24.

Figure 2:
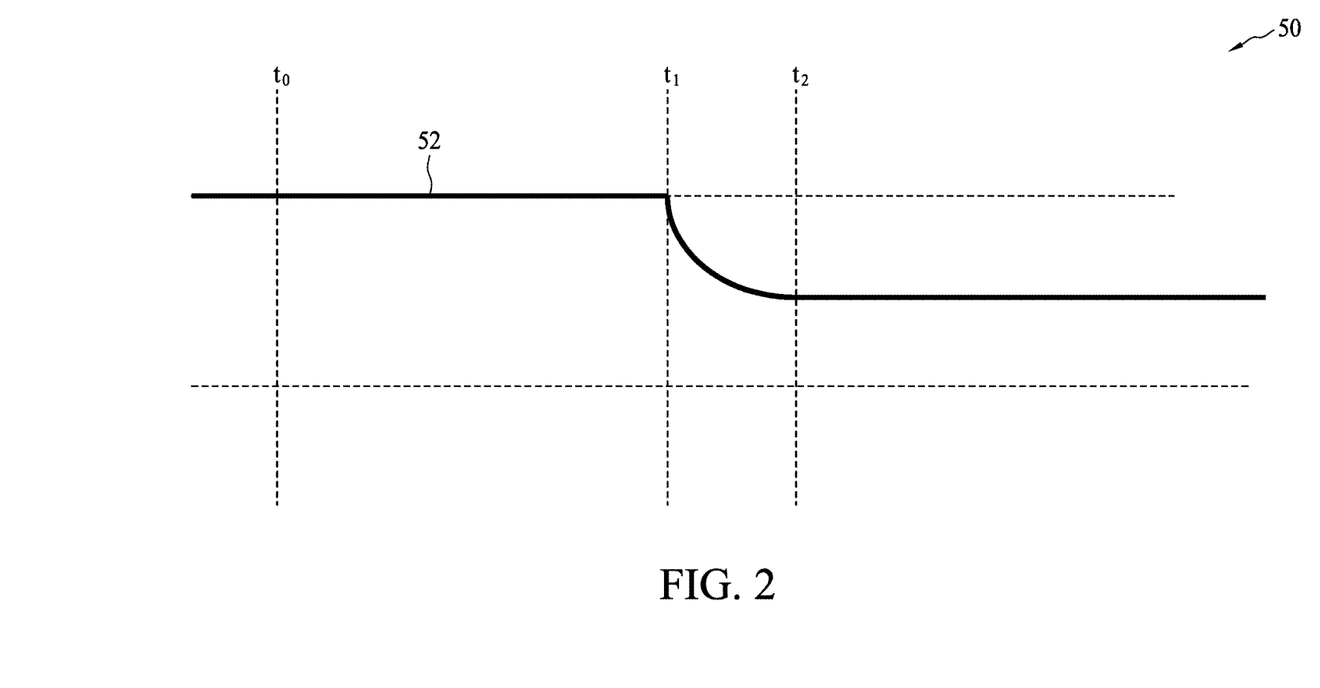
FIG. 2 illustrates a timing diagram of a voltage array coupled to the write-assist cell of FIG. 1, in accordance with some embodiments.

FIG. 2 illustrates a timing diagram 50 of the voltage 52 of the voltage array 12, in accordance with some embodiments. As shown in FIG. 2, at time $t_0$, the voltage 52 is set at an system voltage. The initial voltage 52 can be set by one or more suitable circuit elements in a memory array (not shown). At time $t_1$, a control signal 22 turns on one or more transistors, such as PG transistors 16a, 16b and write-assist transistors 20a, 20b. The activated transistors 16a, 16b, 20a, 20b pull the array voltage 52 down from CVDD. At time $t_2$, the voltage 52 of the voltage array 12 is pulled down to the predetermined write voltage. In some embodiments, the predetermined write voltage is equal to the threshold voltage of the PU transistors 4a, 4b. The lower predetermined write voltage increases the efficiency of one or more memory cells (e.g., bit-cells) coupled to the voltage array 12 during a write operation.

Figure 3:
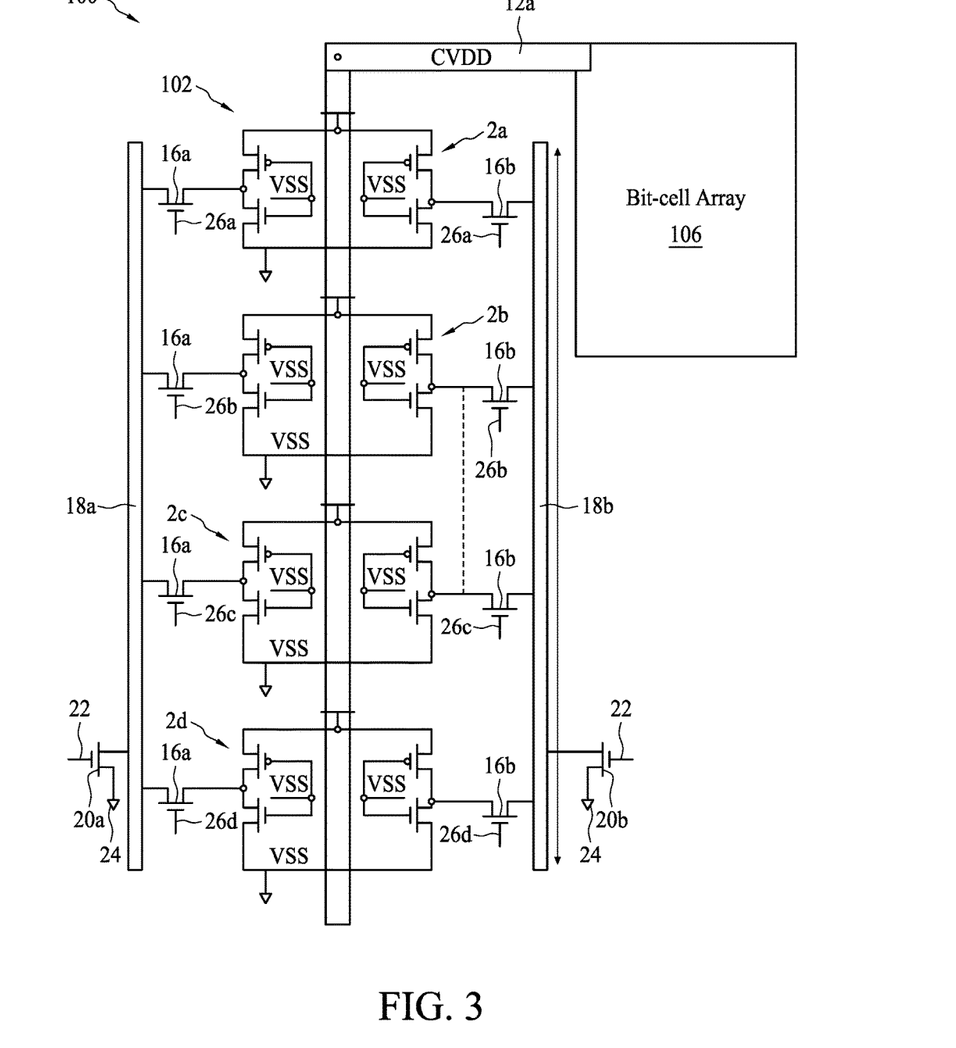
FIG. 3 illustrates a schematic diagram of a write-assist column of a memory array comprising a plurality of write-assist cells, in accordance with some embodiments.

FIG. 3 illustrates a memory array 100 having a write-assist column 102, in accordance with some embodiments. The write-assist column 102 includes a plurality of write-assist cells 2a-2d. The write-assist cells 2a-2d are similar to the write-assist cell 2 described above, and similar description is not repeated herein. The PG transistors 16a, 16b of each of the write-assist cells 2a-2d are coupled to one of a BL 18a or a BLB 18b, respectively. Each of write-assists cells 2a-2d are further coupled to a voltage array 12a. The write-assist cells 2a-2d are configured to pull the voltage of the voltage array 12a from a system voltage down to a predetermined write-voltage.

In some embodiments, the PG transistors 16a, 16b of each of the write-assist cells 2a-2d are configured to receive a cell-activation signal 26a-26d. The cell-activation signals 26a-26d can be independent activation signals and/or a single activation signal received by two or more of the write-assist cells 2a-2d. In some embodiments, the cell-activation signals 26a-26d are configured to independently activate each of the write-assist cells 2a-2d during a pull-down operation. As compared to the write-assist cell 2 of FIG. 1, which used the same control signal 22 for both the PG transistors 16a, 16b and the write-assist transistors 20a, 20b, the write-assist cells 2a-2d each receive a cell activation signal 26a-26d that is independent of the control signal 22 received at the write-assist transistors. The independent activation signals 26a-26d allow each of the write-assist cells 2a-2d to be turned on or off as needed. In some embodiments, the number of activated write-assist cells 2a-2d corresponds to a pull-down time of the write-assist column 102. The pull-down time is a time required for the voltage of the voltage array 12a to be pulled down from the system voltage to the predetermined write voltage. For example, in some embodiments, each of the write-assist cells 2a-2d adjust the pull-down time by a predetermined factor. The pull-down time can be adjusted from a first (or slowest) time (e.g., only one of the write-assist cells 2a-2d are active) to a second (or fastest) time (e.g., all of the write-assist cells 2a-2d are active) in a number of increments equal to the number of write-assist cells 2a-2d.

In some embodiments, the voltage array 12a is coupled to a memory array 106. In some embodiments, the memory array 106 includes an array of bit-cells arranged in a plurality of rows and a plurality of columns. The bit-cells can comprise any suitable bit-cells, such as, for example, a six-transistor (6T) bit-cell, a ten-transistor (10T) bit-cell, and/or any other suitable bit-cell. Each of the bit-cells in the memory array 106 are coupled to the voltage array 12a. Prior to and/or during a write operation of one or more of the bit-cells in the memory array 106, one or more of the write-assist cells 2a and the write-assist PD transistors 20a, 20b are activated to pull the voltage of the voltage array 12a from the system voltage to the predetermined write voltage. The lower write voltage allows the write operation to be completed with a lower supply voltage, increasing the efficiency of the memory array 106. After the write operation is complete, the write-assist column 102 is deactivated (e.g., the PG transistors 16a, 16b and the write-assist transistors 20a, 20b are turned off) and the voltage of the voltage array 12a returns to the system voltage to allow for one or more additional operations, such as a read operation, and to maintain a sufficient headroom for the memory array 106. Although embodiments are illustrated herein showing four write-assist cells 2a-2d in a write-assist column 102, it will be appreciated that the write-assist column 102 can include any number of write-assist cells 2a-2d.

Figure 4:
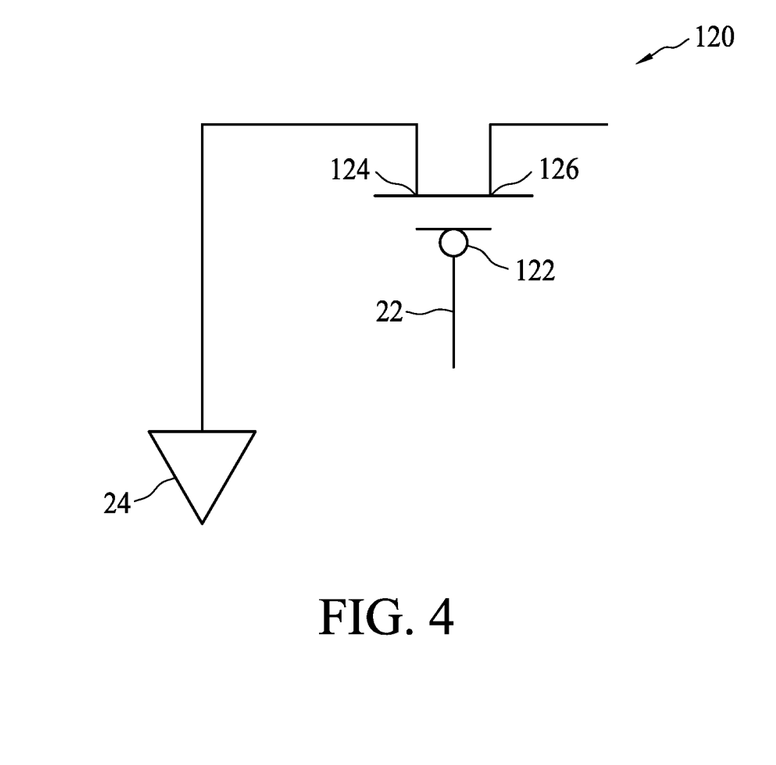
FIG. 4 illustrates a schematic diagram of a pull-down logic arrangement of the write-assist cell of FIG. 1, in accordance with some embodiments.

FIG. 4 illustrates one embodiment of a PMOS PD write-assist transistor 120, in accordance with some embodiments. As shown in FIG. 4, the PMOS PD write-assist transistor 120 has a gate 122 configured to receive a control signal 22. A source 124 of the PMOS pull-down write-assist transistor 120 is coupled to a pull-down voltage input 24 and a drain 126 is coupled to one of a BL or a BLB (not shown). The PMOS pull-down write-assist transistor 120 is configured to couple the BL and/or the BLB to a pull-down voltage. The PMOS pull-down write-assist transistor 120 maintains the BL and/or the BLB at the pull-down voltage during a pull-down operation of the voltage array 12, 12a.

The PMOS PD write-assist transistor 120 prevents the voltage of the BL/BLB (and associated voltage array 12, 12a) from being pulled below a threshold voltage of the PMOS PD write-assist transistor 120. If the voltage on a drain 126 of the PMOS PD write-assist transistor 120 is equal to the threshold voltage, the PMOS PD write-assist transistor 120 is turned off and the voltage at the drain 126 is maintained at a voltage at least equal to the threshold voltage. Because the PMOS PD write-assist transistor 120 is self-limiting at the threshold voltage, the voltage on an attached voltage array 12, 12a cannot drop below the threshold voltage of the PMOS PD write-assist transistor 120, preventing bit-errors and/or other memory errors in a memory array 106 attached to the voltage array 12a. In some embodiments, the threshold voltage of the PMOS PD write-assist transistor 120 is higher than a threshold voltage of each of the transistors in a memory array 106 coupled to the voltage array 12a.

Figure 5:
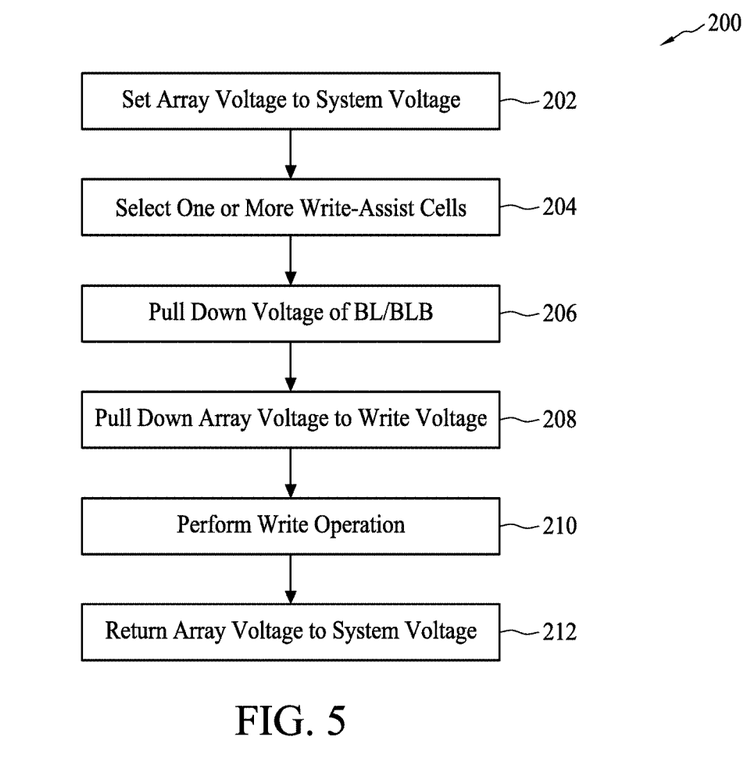
FIG. 5 is a flowchart illustrating a method of operating the write-assist memory array of FIG. 3, in accordance with some embodiments.

FIG. 5 is a flowchart illustrating a method 200 of operating the write-assist memory array 100 of FIG. 3, in accordance with some embodiments. At step 202, a voltage of a voltage array 12a is set to a system voltage. The voltage of the voltage array 12a can be set by one or more additional circuit elements (not shown) coupled to the voltage array 12a. At step 204, one or more of the write-assist cells 2a-2d in the write-assist column 102 are selected. The write-assist cells 2a-2d can be selected by setting one or more control signals 26a-26d to a first value configured to turn on the respective PG transistors 16a, 16b. In some embodiments, the number of write-assist cells 2a-2d selected corresponds to a desired pull-down time for one or more write operations.

At step 206, a voltage of a BL 18a and/or a BLB 18b is set to a pull-down voltage. The BL 18a and/or the BLB 18b are set to the pull-down voltage by turning on a first write-assist transistor 20a and a second write-assist transistor 20b to connect the BL 18a and the BLB 18b, respectively, to the pull-down voltage input 24. The first and second write-assist transistors 20a, 20b can comprise PMOS PD transistors, although it will be appreciated that the write-assist transistors 20a, 20b can include any suitable transistor, such as PMOS/NMOS PD transistors, PMOS/NMOS PU transistors, and/or any other suitable transistors.

At step 208, the voltage of the voltage array 12a is pulled down from the system voltage to a predetermined write voltage. The voltage of the voltage array 12a is pulled down by turning on a first PG transistor 16a and a second PG transistor 16b to connect the first and second nodes 8a, 8b to respective BL 18a and BLB 18b. As noted above, the first and second PG transistors 16a, 16b can be turned on (i.e., selected) by one or more control signals 26a-26d. The pull-down voltage of the BL 18a and/or the BLB 18b pulls the voltage of the voltage array 12a to a predetermined write voltage.

At step 210, a write operation can be performed by one or more memory arrays 106 coupled to the voltage array 12. At step 212, the voltage of the voltage array 12a is reset to the system voltage.

In various embodiments, a write-assist cell is disclosed. The write-assist cell includes a first pull-up transistor electrically coupled to a voltage array and a first node and a first pass-gate transistor electrically coupled to the first node. A bit-line is electrically coupled to the first pass-gate transistor and a pull-down voltage. The first pass-gate is configured to selectively couple the bit-line to the first node. The pull-down voltage is configured to adjust a voltage of the voltage array from a first voltage to a second voltage when the bit-line is coupled to the first node.

In various embodiments, a memory array is disclosed. The memory array includes a voltage array, a write-assist column, a bit-line, and a bit-cell array. The write-assist column includes a plurality of write-assist cells. Each of the write assist cells includes a first pull-up transistor electrically coupled to the voltage array and a first node and a first pass-gate transistor electrically coupled to the first node. The bit-line is electrically coupled to the first pass-gate transistor of each of the plurality of write-assist cells and a pull-down voltage. Each of the first pass-gates is configured to selectively couple the bit-line to the first node. The pull-down voltage is configured to adjust a voltage of the voltage array from a first voltage to a second voltage when the bit-line is coupled to one or more of the first nodes. The bit-cell array includes a plurality of bit-cells each electrically coupled to the voltage array.

In various embodiments, a method is disclosed. The method includes setting a bit-line to a first voltage. An array voltage of a memory array is pulled down from a second voltage to the first voltage by coupling the bit-line to the memory array. A write operation is performed on the memory array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A write-assist cell, comprising:
 a first pull-up transistor electrically coupled to a voltage array and a first node;
 a first pass-gate transistor electrically coupled to the first node; and
 a bit-line electrically coupled to the first pass-gate transistor and a pull-down voltage, wherein the first pass-gate transistor is configured to selectively couple the bit-line to the first node, and wherein the pull-down voltage is configured to adjust a voltage of the voltage array from a first voltage to a second voltage when the bit-line is coupled to the first node.

2. The write-assist cell of claim 1, wherein the bit-line is selectively coupled to the first node by a control signal received at a gate of the first pass-gate transistor.

3. The write-assist cell of claim 1, further comprising a pull-down transistor electrically coupled to the first node and a low-voltage input.

4. The write-assist cell of claim 3, wherein a gate of each of the first pull-up transistor and the pull-down transistor are electrically coupled to the low-voltage input.

5. The memory cell of claim 1, comprising a write-assist transistor electrically coupled between the bit-line and the pull-down voltage, wherein the write-assist transistor is configured to selectively couple the bit-line and the pull-down voltage.

6. The write-assist cell of claim 5, wherein the write-assist transistor is a p-channel metal-oxide semiconductor (PMOS) pull-down (PD) transistor, wherein a source of the PMOS PD transistor is coupled to the pull-down voltage and a drain of the PMOS PD transistor is coupled to the bit-line.

7. The write-assist cell of claim 5, wherein the bit-line is selectively coupled to the pull-down voltage by a control signal received at a gate of the write-assist transistor.

8. The write-assist cell of claim 1, comprising:
 a second pull-up transistor electrically coupled to the voltage array and a second node;
 a second pass-gate transistor electrically coupled to the second node; and
 a complimentary bit-line electrically coupled to the second pass-gate and the pull-down voltage, wherein the second pass-gate is configured to selectively couple the complimentary bit-line to the second node.

9. The write-assist cell of claim 1, wherein the first voltage is a system voltage and the second voltage is a predetermined write voltage.

10. A memory array, comprising:
 a voltage array;
 a write-assist column comprising:
  a plurality of write-assist cells, each of the write assist cells comprising:
   a first pull-up transistor electrically coupled to the voltage array and a first node; and
   a first pass-gate transistor electrically coupled to the first node; and
  a bit-line electrically coupled to the first pass-gate transistor of each of the plurality of write-assist cells and a pull-down voltage, wherein each of the first pass-gates is configured to selectively couple the bit-line to the first node, and wherein the pull-down voltage is configured to adjust a voltage of the voltage array from a first voltage to a second voltage when the bit-line is coupled to one or more of the first nodes; and
 a bit-cell array comprising a plurality of bit-cells each electrically coupled to the voltage array.

11. The memory array of claim 10, wherein the first node of each of the plurality of write-assist cells is selectively coupled to the bit-line by one of a plurality of control signals received at a gate of a first pass-gate transistor.

12. The memory array of claim 11, wherein a pull-down time of the write-assist column is determined by a number of write-assist cells of the plurality of write-assist cells selectively coupled to the bit-line.

13. The memory array of claim 10, comprising a write-assist transistor electrically coupled between the bit-line and the pull-down voltage, wherein the write-assist transistor is configured to selectively couple the bit-line and the pull-down voltage.

14. The memory array of claim 13, wherein the write-assist transistor is a p-channel metal-oxide semiconductor (PMOS) pull-down (PD) transistor, wherein a source of the PMOS PD transistor is coupled to the pull-down voltage and a drain of the PMOS PD transistor is coupled to the bit-line.

15. The memory array of claim 13, wherein the bit-line is selectively coupled to the pull-down voltage by a control signal received at a gate of the write-assist transistor.

16. The memory array of claim 13, wherein the second voltage is equal to a threshold voltage of the write-assist transistor.

17. The memory array of claim 10, wherein the write-assist column comprises:
 a complimentary bit-line electrically coupled to the pull-down voltage; and
 wherein each of the plurality of write-assist cells comprises:
  a second pull-up transistor electrically coupled to the voltage array and a second node;

a second pass-gate transistor electrically coupled to the second node and to the complimentary bit-line, wherein the second pass-gate is configured to selectively couple the complimentary bit-line to the second node.

18. The memory array of claim 10, wherein the second voltage is greater than a threshold voltage of one or more transistors in the bit-cell array.

19. A method, comprising:
setting a bit-line to a first voltage;
pulling down an array voltage of a memory array from a second voltage to the first voltage by coupling the bit-line to the memory array; and
performing a write operation on the memory array.

20. The method of claim 19, wherein setting the bit-line voltage to the first voltage comprises coupling the bit-line to the first voltage by a first transistor.

* * * * *